(12) United States Patent
Kinoshita et al.

(10) Patent No.: US 7,687,360 B2
(45) Date of Patent: Mar. 30, 2010

(54) METHOD OF FORMING SPACED-APART CHARGE TRAPPING STACKS

(75) Inventors: Hiroyuki Kinoshita, San Jose, CA (US); Ning Cheng, San Jose, CA (US); Minghao Shen, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 296 days.

(21) Appl. No.: 11/615,365

(22) Filed: Dec. 22, 2006

(65) Prior Publication Data

US 2008/0149988 A1 Jun. 26, 2008

(51) Int. Cl.
*H01L 21/336* (2006.01)

(52) U.S. Cl. .................. 438/288; 438/257; 438/593; 257/E21.681

(58) Field of Classification Search .......... 438/257, 438/258, 263–264, 266, 288, 591, 396, 405, 438/587, 593–596, 762–765, 261, 267, 279; 257/314, E21.68–E21.682, 315, 321, 324; 365/185.18
See application file for complete search history.

(56) References Cited

U.S. PATENT DOCUMENTS

| | | | |
|---|---|---|---|
| 6,627,927 B2 * | 9/2003 | Wu ............................. | 257/213 |
| 6,649,474 B1 * | 11/2003 | Lin et al. .................... | 438/266 |
| 6,706,595 B2 * | 3/2004 | Yang et al. .................. | 438/258 |
| 6,784,476 B2 * | 8/2004 | Kim et al. ................... | 257/296 |
| 6,803,276 B2 * | 10/2004 | Kim et al. ................... | 438/257 |
| 6,927,446 B2 * | 8/2005 | Yoshino ...................... | 257/314 |
| 7,259,423 B2 * | 8/2007 | Min et al. .................... | 257/324 |
| 7,262,093 B2 * | 8/2007 | Wang .......................... | 438/257 |
| 7,368,347 B2 * | 5/2008 | Joshi et al. .................. | 438/257 |
| 7,511,334 B2 * | 3/2009 | Lee et al. .................... | 257/324 |
| 2003/0141541 A1 * | 7/2003 | Wu ............................. | 257/319 |
| 2005/0196948 A1 * | 9/2005 | Shih ........................... | 438/591 |
| 2006/0011966 A1 * | 1/2006 | Wang .......................... | 257/315 |
| 2006/0121673 A1 * | 6/2006 | Lojek .......................... | 438/257 |
| 2006/0240615 A1 * | 10/2006 | Shih ........................... | 438/257 |
| 2006/0264007 A1 * | 11/2006 | Lee et al. .................... | 438/478 |
| 2007/0063259 A1 * | 3/2007 | Derderian et al. ........... | 257/315 |
| 2007/0187747 A1 * | 8/2007 | Forbes ........................ | 257/315 |
| 2008/0076243 A1 * | 3/2008 | Chang ......................... | 438/593 |

* cited by examiner

*Primary Examiner*—Matthew C Landau
*Assistant Examiner*—Joseph C Nicely

(57) ABSTRACT

Methods are provided for fabricating memory devices. A method comprises fabricating charge-trapping stacks overlying a silicon substrate and forming bit line regions in the substrate between the charge trapping stacks. Insulating elements are formed overlying the bit line regions between the stacks. The charge-trapping stacks are etched to form two complementary charge storage nodes and to expose portions of the silicon substrate. Silicon is grown on the exposed silicon substrate by selective epitaxial growth and is oxidized. A control gate layer is formed overlying the complementary charge storage nodes and the oxidized epitaxially-grown silicon.

20 Claims, 4 Drawing Sheets

US 7,687,360 B2

METHOD OF FORMING SPACED-APART CHARGE TRAPPING STACKS

FIELD OF THE INVENTION

The present invention generally relates to semiconductor memory devices and to methods for their fabrication, and more particularly relates to memory devices and methods for fabricating memory devices, especially dual storage node memory devices.

BACKGROUND OF THE INVENTION

A type of commercially available flash memory product is a MirrorBit® memory device available from Spansion, LLC, located in Sunnyvale, Calif. A MirrorBit memory cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

A portion of an exemplary MirrorBit® memory device 10, illustrated in FIG. 1, includes a P-type semiconductor substrate 12 within which are formed spaced-apart source/drain regions 14, 16 respectively (both typically having N-type conductivity), otherwise known as bit line regions or bit lines. A charge trapping stack 18 is disposed on the top surface of the substrate between the bit lines. The charge trapping stack 18 typically comprises, for example, a charge trapping layer, often a silicon nitride layer 20, disposed between a first or bottom insulating layer 22, such as a silicon dioxide layer (commonly referred to as a tunnel oxide layer), and a second or top insulating layer 24. A gate electrode 26, which typically comprises an N or N+ polycrystalline silicon layer, is formed over the charge trapping stack. An isolation region or "middle gate insulator" 40 divides the charge trapping stack below each gate electrode 26 to form a first charge storage node or bit 28 and a complementary second charge storage node or bit 30 of memory cells 32 and 34.

As devices densities increase and product dimensions decrease, it is desirable to reduce the size of the various structures and features associated with individual memory cells, sometimes referred to as scaling. However, the fabrication techniques used to produce flash memory arrays limit or inhibit the designer's ability to reduce device dimensions. For longer channel devices, it is not necessary to isolate portions of the charge trapping layer of complementary bits, that is, gate insulators 40 in cells 32 and 34 are not necessary. As device dimensions decrease to 45 nm nodes and smaller, isolation of the charge trapping layer portions of the complementary nodes by middle gate insulator 40 becomes advantageous. One type of material used to fabricate middle gate insulator 40 is silicon oxide. However, often during formation of the silicon oxide middle gate insulator 40, the thickness of the tunnel oxide 22 proximate to the middle gate insulator increases due to encroachment of the silicon oxide, forming a "bird's beak". This bird's beak results in degrade device performance. The thickness of the middle gate insulator 40 is partially determined by the memory cell operation method. Thinner middle gate insulators (e.g., <10 nm) may be used in the case of hot hole injection erase, while Fowler-Nordheim (FN) tunneling erase requires higher erase fields and therefore thicker middle gate insulators.

Accordingly, it is desirable to provide methods of fabricating semiconductor memory devices that can be scaled with device dimensions. In addition, it is desirable to provide methods for fabricating dual bit memory devices that do not result in increased thickness of the tunnel oxide layer during formation of the middle gate insulator. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

The invention pertains to a semiconductor device including a silicon substrate and first and second insulating elements disposed on the silicon substrate. First and second bit line regions are disposed in the silicon substrate underlying the first and second insulating elements, respectively. First and second charge storage nodes are disposed along a sidewall of the first and second insulating elements, respectively. Oxidized epitaxially grown silicon is disposed on the silicon substrate between the first and second charge storage nodes.

In accordance with another exemplary embodiment of the present invention, a method for fabricating a dual bit memory device comprises forming a plurality of multi-layer charge-trapping stacks overlying a silicon substrate. A plurality of impurity-doped bit line regions are formed within the substrate. A plurality of insulating elements are then fabricated such that each of the insulating elements overlies one of the bit line regions. The insulating elements are to be each disposed between two adjacent charge-trapping stacks of the plurality of multi-layer charge-trapping stacks. Sidewall spacers are formed overlying portions of the multi-layer charge-trapping stacks and adjacent to sidewalls of each of the plurality of insulating elements. Portions of the silicon substrate may now be exposed by etching portions of each of the plurality of multi-layer charge-trapping stacks using the sidewalls spacers as etching masks. Silicon is grown on the exposed portions of the silicon substrate by a process of selective epitaxial growth. The epitaxially grown silicon is then oxidized. Finally, a control gate layer is fabricated overlying the multi-layer charge trapping stacks and the oxidized silicon.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

In accordance with various exemplary embodiments of the present invention, FIGS. 2-11 illustrate method steps for fabricating a dual bit memory device 50 that can be scaled with decreased device dimensions. The methods provide for the isolation of charge trapping layers of complementary charge storage nodes without oxide encroachment into tunnel oxide layers of the charge storage nodes. FIGS. 2-11 illustrate various cross-sectional views of dual bit memory device 50. Various steps in the manufacture of dual bit memory device 50 are well known and so, in the interest of brevity, many conventional steps will only be mentioned briefly herein or will be omitted entirely without providing well known process details.

Figure 1:
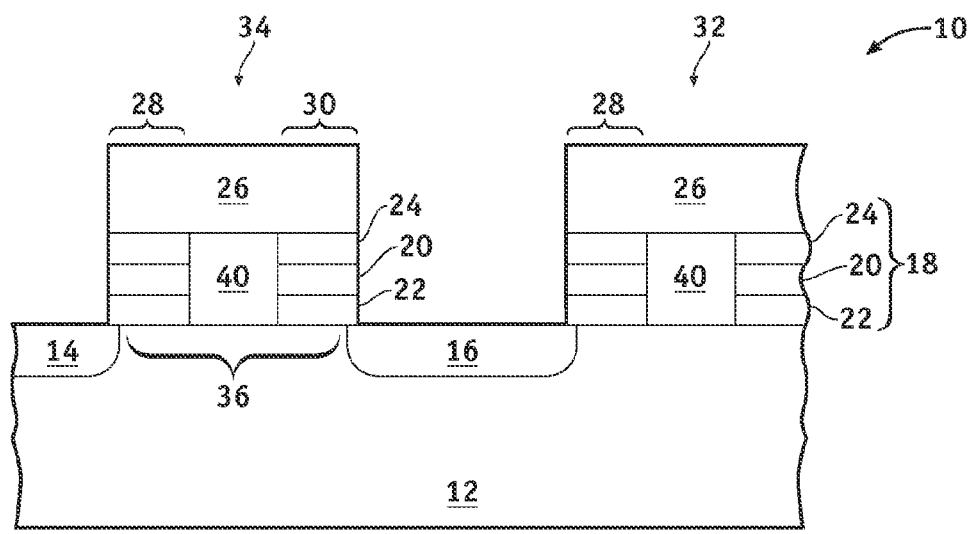
FIG. 1 is a cross-sectional view of a portion of a MirrorBit® dual bit memory device available from Spansion, LLC.
Figure 2:
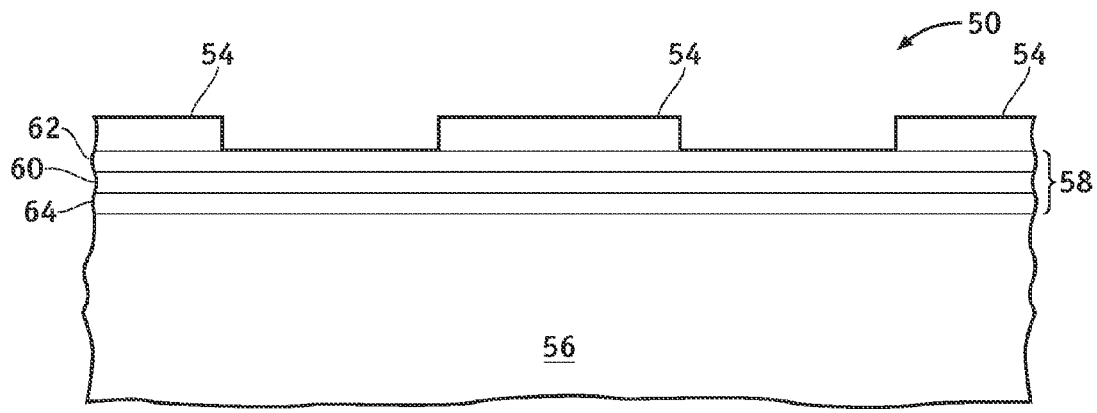
FIGS. 2-11 are cross-sectional views taken along the same axis that illustrate methods for fabricating a dual bit memory device in accordance with exemplary embodiments of the present invention.

As illustrated in FIG. 2, the manufacture of dual bit memory device 50 begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 56 may be a bulk silicon wafer or a thin layer of silicon on an insulating layer (commonly known as a silicon-on-insulator wafer or SOI wafer) that, in turn, is supported by a silicon carrier wafer.

A first insulating layer 64 and a charge trapping layer 60 of a multi-layer dielectric-charge trapping-dielectric stack 58 are formed overlying substrate 56. Preferably insulating layer 64 is a layer of silicon dioxide having a thickness of about 2-10 nanometers (nm), more preferably about 5 nm. Layer 64 can be a thermally grown layer of silicon dioxide or can be deposited, for example, by low pressure chemical vapor deposition (LPCVD). Thin insulator layer 64 is often referred to as a tunnel oxide layer, a layer through which programming or erasing charge carriers can tunnel. Charge trapping layer 60 can be, for example, a layer of silicon nitride, silicon-rich silicon nitride, polycrystalline silicon, a combination of these, or any of the other well known charge trapping materials. Stoichiometric silicon nitride is $Si_xN_y$, for which x=3 and n=4; silicon-rich silicon nitride is a silicon/nitrogen material for which x/y is greater than 3/4. Charge trapping layer 60 can be deposited, for example, to a thickness of about 3 to 20 nm by chemical vapor deposition (CVD), plasma enhanced chemical vapor deposition (PECVD), LPCVD, or by atomic layer deposition (ALD). The layers comprising stack 58 can be any suitable multi-layer dielectric-charge trapping-dielectric stack comprising first insulating layer 64, silicon nitride layer 60 overlying first insulating layer 64, and a second insulating layer 62 overlying silicon nitride layer 60. Preferably, second insulating layer 62 comprises a silicon oxide. In an exemplary embodiment of the invention, multi-layer stack 58 has a total thickness that is no greater than about 25 nm. The silicon oxide layers can be deposited, for example, from either a tetraethylorthosilicate (TEOS) or $SiH_4$ (silane) source or can be grown thermally from silicon, silicon nitride, or silicon-rich silicon nitride. The silicon nitride or silicon-rich silicon nitride can be deposited, for example, from the reaction of dichlorosilane and ammonia.

Figure 3:
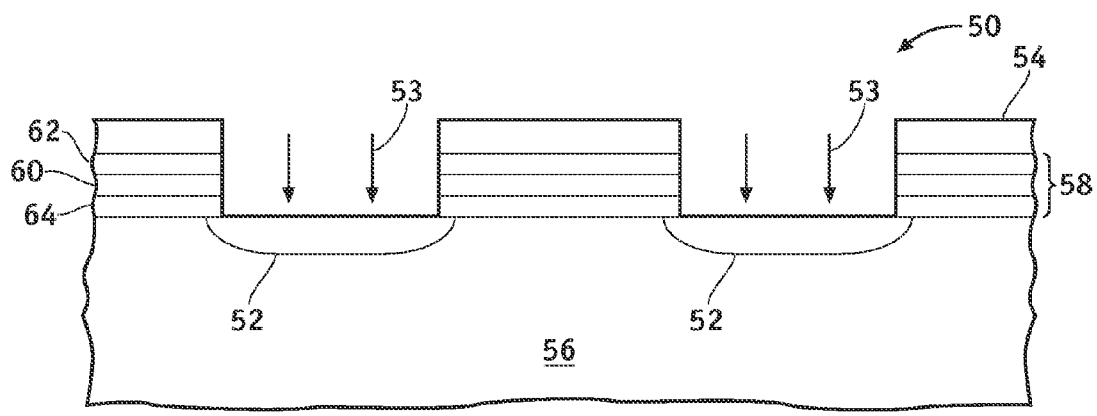

A hard mask layer 54 is formed overlying second insulating layer 62 and is selectively patterned using conventional photolithography methods to expose a surface of second insulating layer 62 that overlies bit line regions 52. Using hard mask layer 54 as an etch mask, second insulating layer 62, charge trapping layer 60, and first insulating layer 64 are etched by an anisotropic etch process(es), as illustrated in FIG. 3.

The hard mask layer 54 then is used as an ion implantation mask and conductivity-determining ions, indicated by arrows 53, are implanted into silicon substrate 56 to form a plurality of spaced-apart bit line regions 52. In a preferred embodiment, semiconductor substrate 56 is impurity doped with P-type and N-type ions such as arsenic ions or phosphorus ions to form N-type bit lines.

Figure 4:
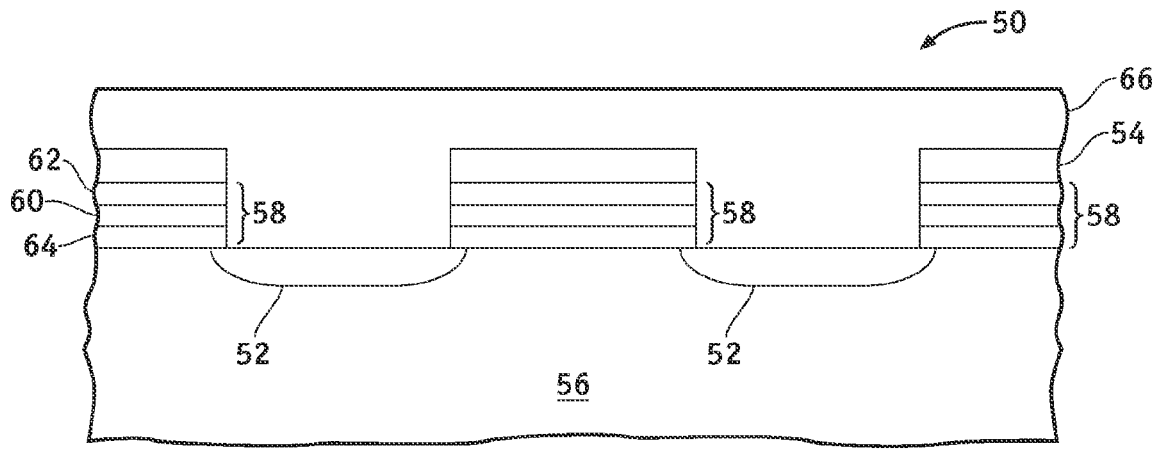
Figure 5:
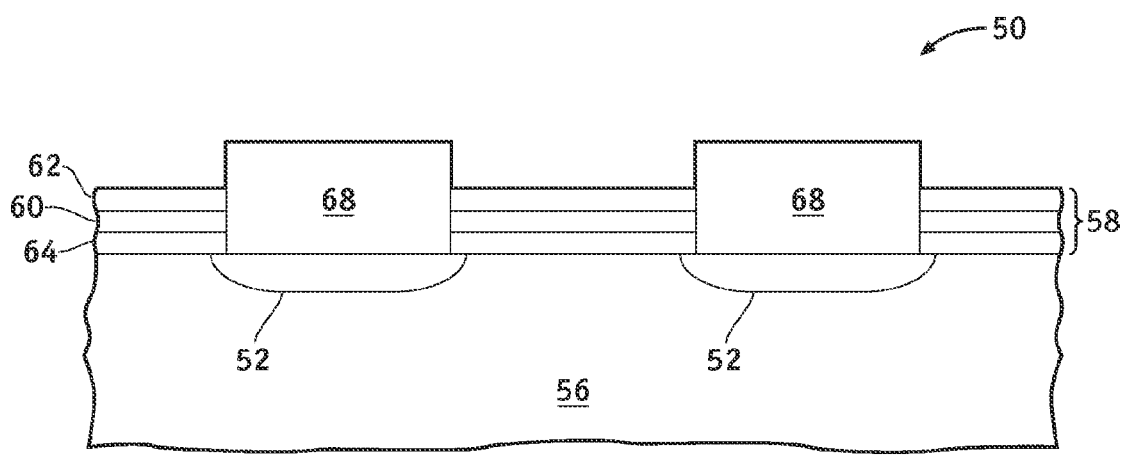

Referring to FIG. 4, the method in accordance with an embodiment of the invention continues by the deposition of a third insulating material 66 overlying the hard mask layer 54 and filling the gaps between the multi-layer stacks 58. The insulating material can be, for example, a deposited silicon oxide, such as a high density plasma (HDP) oxide. Following the deposition, the top surface of insulating material 66 can be planarized by chemical mechanical planarization (CMP) to expose the hard mask layer 54 and to form insulating elements 68 overlying bit line regions 52. In a preferred embodiment of the invention, the CMP process step is followed by an etch step to remove the hard mask layer 54 and to expose the top surfaces of multi-layer stacks 58, as illustrated in FIG. 5.

Figure 6:
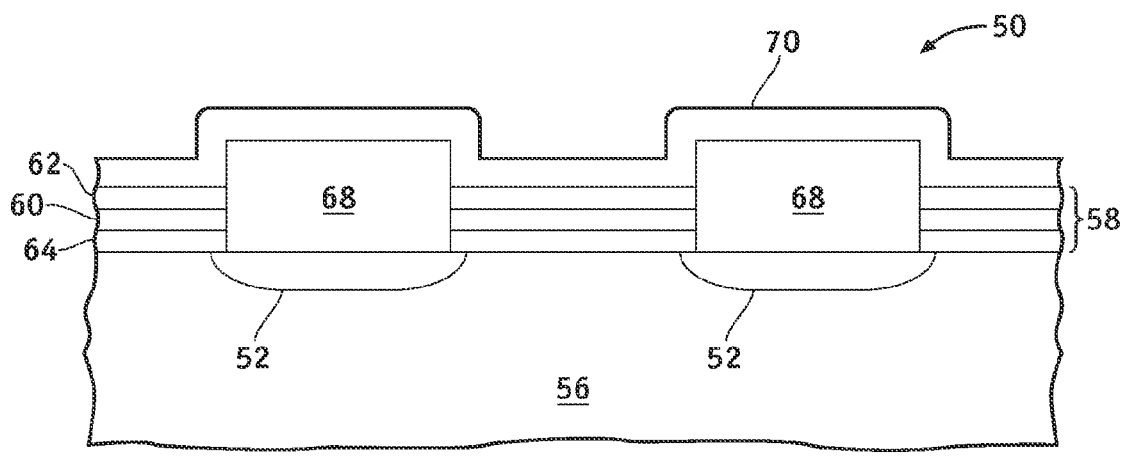
Figure 7:
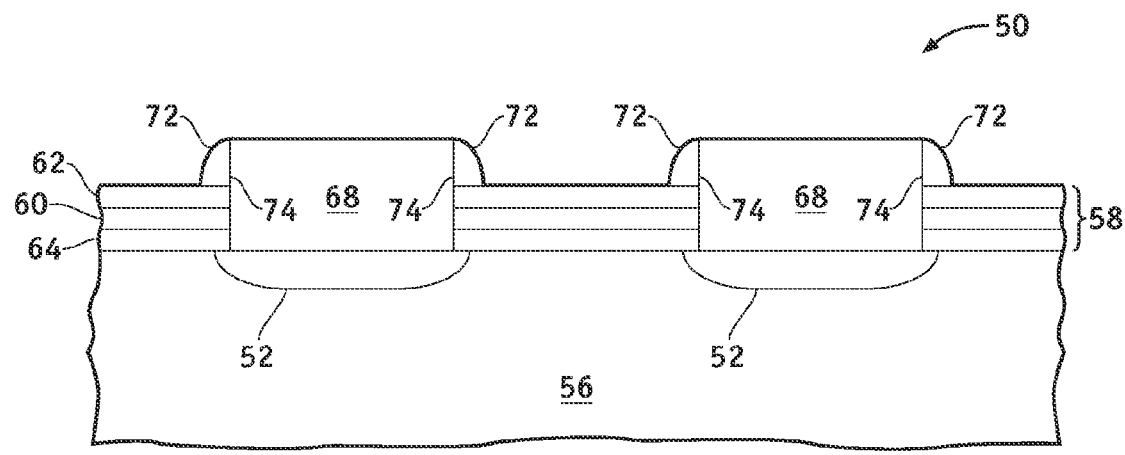
Figure 8:
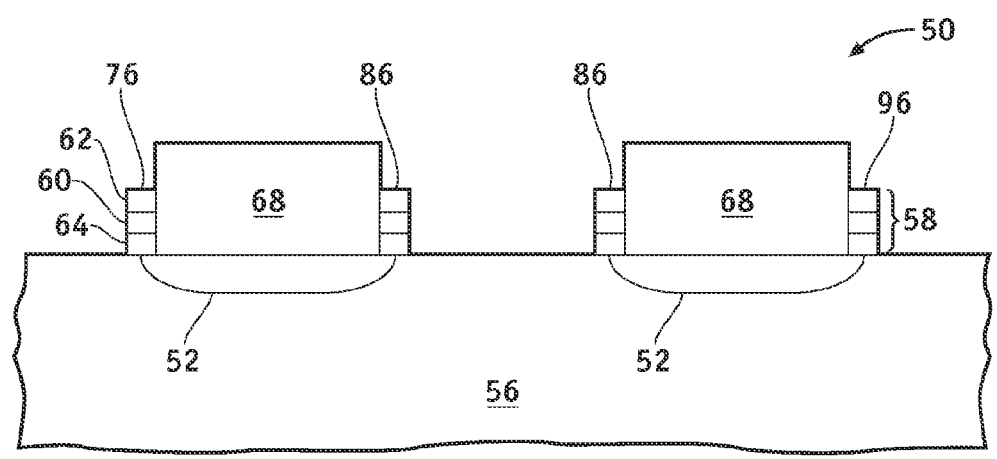

Referring to FIG. 6, a layer 70 of material that has an etch property that is different from that of second insulating layer 62, such as, for example, a silicon nitride, is conformally deposited overlying memory device 50 and is anisotropically etched to form sidewall spacers 72 about the exposed portions of sidewalls 74 of insulating members 68, as illustrated in FIG. 7. Using sidewall spacers 72 as an etch mask, second insulating layer 62, charge trapping layer 60, and first insulating layer 64 of each multi-layer stack are etched by an anisotropic etch process(es), thus exposing substrate 56 and forming two complementary charge storage nodes 76, 86, and 96 from each multi-layer stack between adjacent insulating members 68, as illustrated in FIG. 8. In an exemplary embodiment of the invention, during the etching process sidewall spacers 72 also are substantially removed. If sidewall spacers 72 are not substantially removed during the etching of multi-layer stack 58, they can be removed thereafter.

Figure 9:
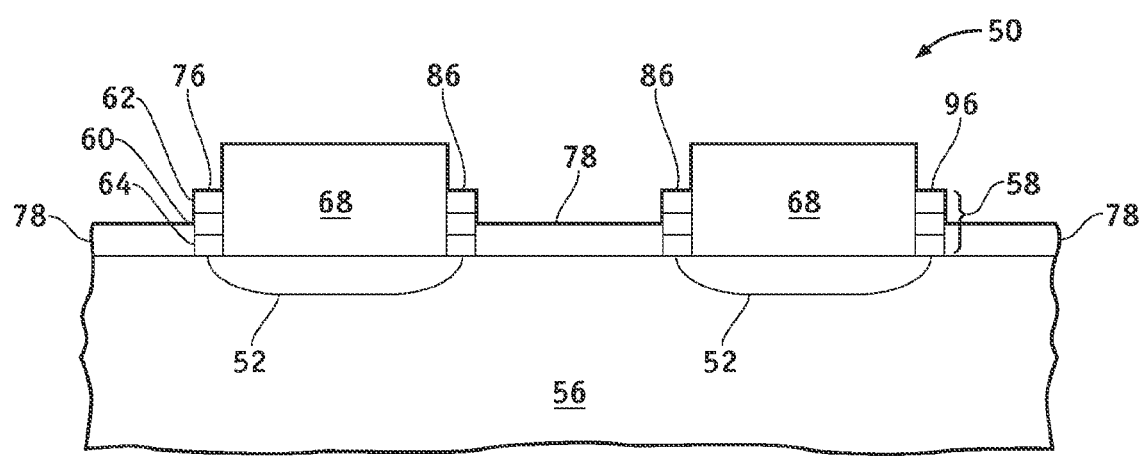

The method in accordance with an embodiment of the invention continues with the selective epitaxial growth of silicon 78 on the exposed silicon substrate 56 between the two complementary charge storage nodes 76, 86, and 96, as illustrated in FIG. 9. The epitaxial silicon layers can be grown by the reduction of silane ($SiH_4$) or dichlorosilane ($SiH_2Cl_2$) in the presence of HCl. The presence of the chlorine source promotes the selective nature of the growth, that is, the growth of the epitaxial silicon preferentially on the exposed silicon surfaces as opposed to on the insulator (silicon oxide or nitride) surfaces. The epitaxial silicon layers grow with crystalline orientation that mimics the crystalline orientation of the silicon material upon which they are grown. In an exemplary embodiment of the present invention, the semiconductor material is grown to a thickness in the range of about 2 to 15 nm.

Figure 10:
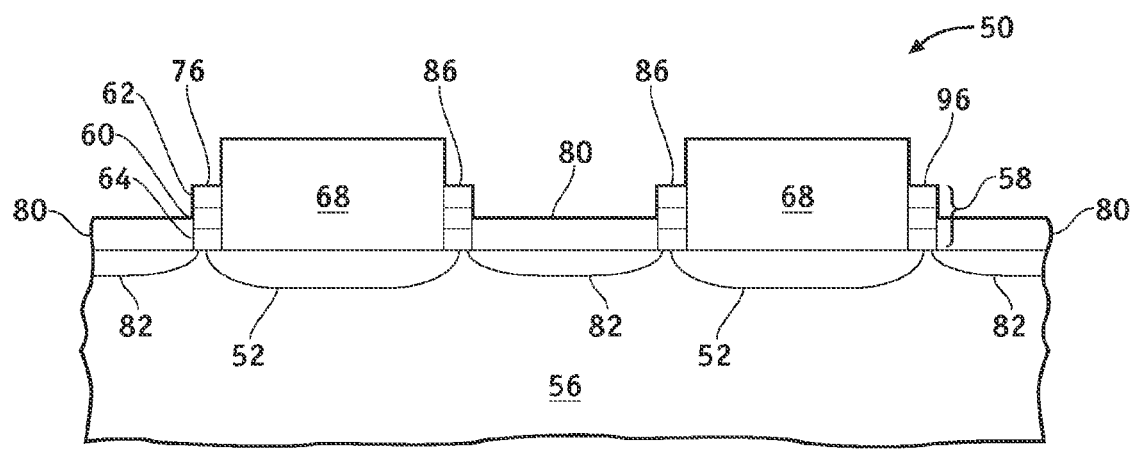

Referring to FIG. 10, the epitaxially grown semiconductor material 78 then is thermally oxidized to form middle gate regions 80 between the complementary charge storage nodes 76, 86, and 96. Methods for thermally growing a silicon oxide from silicon are well known in the art and will not be discussed further here. In one exemplary embodiment of the invention, the silicon 78 is partially oxidized. In another exemplary embodiment of the invention, the silicon 78 is substantially fully oxidized. In yet another exemplary embodiment of the invention, the silicon 78 as well as underlying portions 82 of the silicon substrate 56 are oxidized. As will be appreciated, by epitaxially growing the silicon 78 between the complementary charge storage nodes and subsequently oxidizing the silicon, a middle gate insulator 80 may be formed between the complementary charge storage nodes without increasing the thickness of the tunnel oxide 64.

Figure 11:
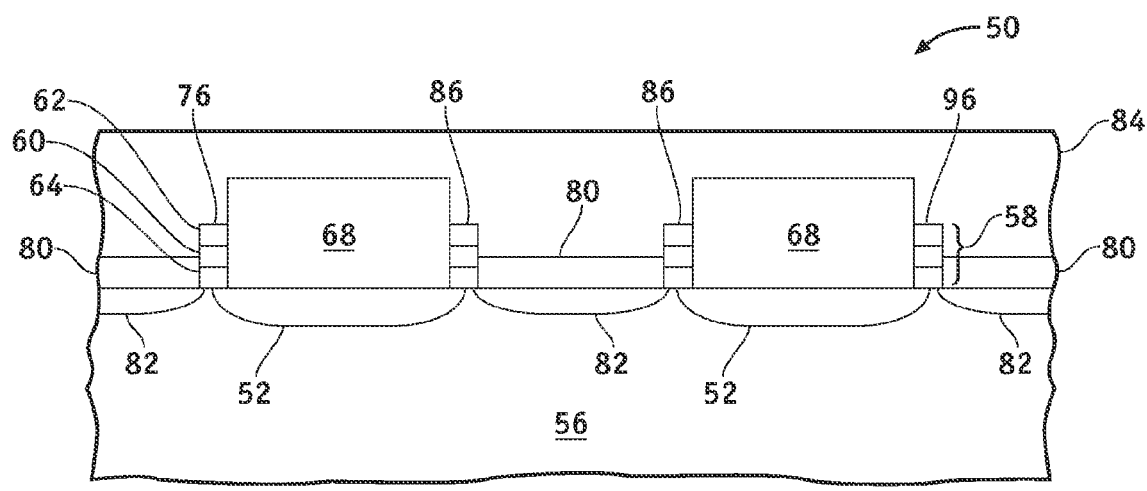

As illustrated in FIG. 11, the method in accordance with one embodiment of the invention is continued by depositing a blanket control gate layer 84 of polycrystalline silicon or other conductive material on the exposed top surfaces of charge storage nodes 76, 86, 96 and middle gate insulator 80. The blanket layer is preferably deposited as an impurity doped layer of polycrystalline silicon or can be deposited as a polycrystalline silicon that is subsequently doped by ion implantation. The control gate layer 84 is patterned and etched to define the control gates.

Those of skill in the art will appreciate that a completed memory device will include isolation such as shallow trench isolation between devices that need to be electrically isolated, electrical contacts to the bit line regions and to the word lines, bit line drivers, word line drivers, clock circuits, address decoding circuits and the like. Fabrication of such structural and circuit elements can be easily integrated with the method for fabricating the memory device structure that has been described herein to fabricate a complete semiconductor memory device.

Accordingly, methods for fabricating dual bit memory devices have been provided. Because the methods provide for the epitaxial growth of silicon between complementary charge storage nodes followed by oxidation of the silicon, middle gate insulators may be formed between complementary charge storage nodes without adverse effects to the tunnel oxide layer. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor memory device, the method comprising the steps of:
    fabricating a plurality of spaced-apart charge-trapping stacks overlying a silicon substrate;
    forming a plurality of bit line regions in the silicon substrate between the spaced-apart charge-trapping stacks;
    fabricating a plurality of insulating elements overlying the exposed bit line regions and between the spaced-apart charge-trapping stacks;
    etching a portion of each of the plurality of spaced-apart charge trapping stacks to form two complementary charge storage nodes from each of the charge trapping stacks and to expose a portion of the silicon substrate between the two complementary charge storage nodes;
    growing silicon on the exposed portions of the silicon substrate by a process of selective epitaxial growth;
    oxidizing at least a portion of the epitaxially grown silicon, and at least a portion of the silicon substrate underlying the epitaxially grown silicon; and
    fabricating a control gate layer overlying the complementary charge storage nodes and the oxidized epitaxially grown silicon.

2. The method of claim 1, wherein the step of fabricating a plurality of spaced apart charge-trapping stacks overlying the substrate comprises the steps of:
    forming a first insulating layer overlying the substrate;
    fabricating a charge trapping layer overlying the first insulating layer;
    forming a second insulating layer overlying the charge trapping layer;
    forming a patterned etch mask overlying the second insulating layer; and
    anisotropically etching the second insulating layer, the charge trapping layer, and the first insulating layer.

3. The method of claim 2, wherein the step of fabricating a charge trapping layer comprises the step of fabricating a layer of silicon nitride, silicon-rich silicon nitride, polycrystalline silicon, or a combination thereof.

4. The method of claim 1, wherein the step of etching a portion of each of the plurality of spaced-apart charge trapping stacks comprises the steps of:
    depositing a layer of material that has an etch property different from that of the second insulating layer overlying the charge-trapping stacks and the insulating elements;
    anisotropically etching the layer of material to form sidewall spacers overlying a portion of the charge trapping stacks and adjacent sidewalls of the insulating elements; and
    anisotropically etching the second insulating layer, the charge trapping layer, and the first insulating layer using the sidewall spacers as etch masks.

5. The method of claim 1, wherein the step of fabricating a plurality of insulating elements comprises the steps of:
    depositing a blanket layer of an insulating material overlying the spaced-apart charge trapping stacks and between the spaced-apart charge trapping stacks; and
    planarizing the blanket layer to remove portions of the blanket layer overlying the charge trapping stacks.

6. The method of claim 1, wherein the step of growing silicon comprises the steps of growing silicon to a thickness in the range of about 2 nm to about 15 nm.

7. The method of claim 1, wherein the step of oxidizing a least a portion of the epitaxially grown silicon comprises the step of oxidizing substantially all of the epitaxially grown silicon.

8. The method of claim 1, wherein the step of fabricating a plurality of insulating elements comprises the step of fabricating a plurality of insulating elements from high density plasma silicon oxide.

9. A method for fabricating a dual bit memory device, the method comprising the steps of:
    forming a plurality of multi-layer charge-trapping stacks overlying a silicon substrate;
    implanting impurity dopants into the silicon substrate to form a plurality of impurity-doped bit line regions between the multi-layer charge-trapping stacks;
    fabricating a plurality of insulating elements, wherein each of the plurality of insulating elements overlies one of the plurality of bit line regions and is disposed between two adjacent charge-trapping stacks of the plurality of multi-layer charge-trapping stacks;
    forming sidewall spacers overlying portions of the multi-layer charge-trapping stacks and adjacent sidewalls of each of the plurality of insulating elements;
    etching portions of each of the plurality of multi-layer charge-trapping stacks using the sidewalls spacers as etching masks to expose portions of the silicon substrate;
    growing silicon on the exposed portions of the silicon substrate by a process of selective epitaxial growth;
    oxidizing the epitaxially grown silicon, and at least a portion of the silicon substrate underlying the epitaxially grown silicon; and fabricating a control gate layer overlying the multi-layer charge trapping stacks and the oxidized silicon.

10. The method of claim 9, wherein the step of implanting impurity dopants into a silicon substrate comprises the step of implanting arsenic ions or phosphorous ions into the silicon substrate.

11. The method of claim 9, wherein the step of forming a plurality of multi-layer charge-trapping stacks comprises the steps of
forming a first insulating layer overlying the silicon substrate;
fabricating a charge trapping layer overlying the first insulating layer;
forming a second insulating layer overlying the charge trapping layer;
forming a patterned etch mask overlying the second insulating layer; and
anisotropically etching the second insulating layer, the charge trapping layer, and the first insulating layer.

12. The method of claim 11, wherein the step of fabricating a charge trapping layer comprises the step of fabricating a layer of silicon nitride, silicon-rich silicon nitride, polycrystalline silicon, or a combination thereof.

13. The method of claim 9, wherein the step of fabricating a plurality of insulating elements comprises the steps of:
depositing an insulating material layer overlying the charge-trapping stacks and the bit line regions; and
removing portions of the insulating material layer that overlie the charge-trapping stacks.

14. The method of claim 9, wherein the step of forming sidewall spacers overlying portions of the plurality of multi-layer charge-trapping stacks and adjacent sidewalls of each of the plurality of insulating elements comprises the steps of:
depositing overlying the charge-trapping stacks and the insulating elements a conformal layer of a material that has an etch property that is different from that of a top surface of the charge-trapping stacks; and
anisotropically etching the conformal layer.

15. The method of claim 9, wherein the step of growing silicon on the exposed portions of the silicon substrate comprises the step of growing silicon to a thickness in the range of about 2 nm to about 15 nm.

16. The method of claim 9, wherein the step of oxidizing the epitaxially grown silicon comprises the step of partially oxidizing the epitaxially grown silicon.

17. The method of claim 9, wherein the step of oxidizing the epitaxially grown silicon comprises the step of substantially fully oxidizing the epitaxially grown silicon.

18. A method for fabricating a semiconductor memory device, the method comprising the steps of:
providing a silicon substrate having spaced-apart bit line regions therein;
forming a first silicon oxide layer overlying the silicon substrate;
fabricating a silicon-rich silicon nitride layer overlying the first silicon oxide layer;
forming a second silicon oxide layer overlying the silicon-rich silicon nitride layer;
forming a patterned etch mask overlying the second silicon oxide layer;
anisotropically etching the second silicon oxide layer, the silicon-rich silicon nitride layer, and the first oxide layer to form multi-layer stacks overlying the silicon substrate;
fabricating bit line regions in the silicon substrate using the patterned etch mask as an ion implantation mask;
fabricating high density plasma silicon oxide (HDP) elements overlying the bit line regions and between the multi-layer stacks;
removing the patterned etch mask to expose portions of sidewalls of the HDP elements;
forming a conformal silicon nitride layer overlying the multi-layer stacks and the HDP elements;
anisotropically etching the conformal silicon nitride layer to form sidewall spacers overlying the multi-layer stacks and adjacent the exposed portions of the sidewalls of the HDP elements;
anisotropically etching the multi-layer stacks using the sidewall spacers as etch masks to form spaced-apart charge storage nodes and to expose portions of the silicon substrate;
growing silicon on the silicon substrate using selective epitaxial growth;
at least partially oxidizing the epitaxially grown silicon; and
depositing a polycrystalline silicon layer over the charge storage nodes, the oxidized silicon, and the HDP elements.

19. The method of claim 18, wherein the step of at least partially oxidizing the epitaxially grown silicon comprises the step of oxidizing substantially all of the epitaxially grown silicon.

20. The method of claim 18, wherein the step of at least partially oxidizing the epitaxially grown silicon comprises the step of oxidizing a portion of the silicon substrate underlying the epitaxially grown silicon.

* * * * *